(12) United States Patent
Ohkubo

(10) Patent No.: US 6,670,211 B2
(45) Date of Patent: Dec. 30, 2003

(54) SEMICONDUCTOR LASER DEVICE

(75) Inventor: Michio Ohkubo, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/876,278

(22) Filed: Jun. 6, 2001

(65) Prior Publication Data
US 2002/0006710 A1 Jan. 17, 2002

(30) Foreign Application Priority Data

Jun. 8, 2000 (JP) ........................ 2000-172065

(51) Int. Cl.[7] ................ H01L 21/00; H01L 29/06; H01L 29/221; H01L 29/22; H01L 5/00
(52) U.S. Cl. .................... 438/33; 438/41; 438/42; 438/43; 438/46; 257/14; 257/96; 257/99; 372/43; 372/46
(58) Field of Search .................. 438/36, 41, 33.42, 438/46; 372/43, 46; 148/DIG. 84, DIG. 95; 257/14, 96, 99

(56) References Cited

U.S. PATENT DOCUMENTS

| 4,670,214 A | * | 6/1987 | Magnuson et al. ............ 419/3 |
| 4,696,953 A | * | 9/1987 | Tom ............................. 521/146 |
| 4,716,181 A | * | 12/1987 | Tom ............................. 521/53 |
| 4,891,093 A | * | 1/1990 | Smith ........................... 156/613 |
| 4,971,928 A | * | 11/1990 | Fuller .......................... 437/129 |
| 5,144,634 A | | 9/1992 | Gasser et al. ................. 372/49 |
| 5,216,684 A | * | 6/1993 | Wang et al. ................... 372/45 |
| 5,227,330 A | * | 7/1993 | Agnello et al. ............. 437/108 |
| 5,298,452 A | * | 3/1994 | Meyerson ...................... 437/81 |
| 5,436,196 A | * | 7/1995 | Miyashita ..................... 437/129 |
| 5,567,659 A | * | 10/1996 | Pakulski et al. ............. 437/228 |
| 5,780,320 A | * | 7/1998 | Kinoshita ..................... 438/33 |
| 5,906,680 A | * | 5/1999 | Meyerson ...................... 117/88 |
| 5,976,904 A | * | 11/1999 | Gotoh et al. .................. 438/33 |

* cited by examiner

Primary Examiner—Wael Fahmy
Assistant Examiner—Shrinivas H. Rao
(74) Attorney, Agent, or Firm—Sheppard Mullin Richter & Hampton LLP

(57) ABSTRACT

A exemplary method of fabricating a semiconductor laser device includes forming an electrode on each of a top surface and a bottom surface of a laminated structure comprised of semiconductor materials, then cleaving the laminated structure to form facets of a cavity, and next epitaxially growing a compound semiconductor on the facets of the cavity. Works involved in the cleavage and the epitaxial crystal growth are performed in a low oxygen and moisture concentration atmosphere, so that the occurrence of COD is suppressed in the fabricated semiconductor laser device.

36 Claims, 3 Drawing Sheets

SEMICONDUCTOR LASER DEVICE

FIELD OF THE INVENTION

The present invention relates to a method of fabricating a semiconductor laser device, and more particularly, to a method of fabricating a semiconductor laser device in which catastrophic optical damage (COD) is suppressed.

BACKGROUND OF THE INVENTION

An exemplary method of fabricating a semiconductor laser device will be shown below.

First, a lower cladding layer made, for example, of n-AlGaAs, a lower optical confinement layer made, for example, of non-doped AlGaAs, an active layer made, for example, of InGaAs/GaAs in a multi-quantum well structure, an upper optical confinement layer made, for example, of non-doped AlGaAs, an upper cladding layer made, for example, of p-AlGaAs, and a cap layer made, for example, of p-GaAs are laminated on a semiconductor substrate made, for example, of n-GaAs by an epitaxial crystal growth method such as an MOCVD method in this order to fabricate a slab laminated structure.

Then, the top surface of the laminated structure is formed into a ridge shape. Subsequently, Ti/Pt/Au, for example, are vapor deposited on the ridge-shaped upper surface to form an upper electrode (p-type electrode) for making an ohmic contact with the cap layer. Also, on the bottom surface of the semiconductor substrate, AuGeNi/Au, for example, are vapor deposited to form a lower electrode (n-type electrode).

Then, the laminated structure is cleaved to have a predetermined cavity length, thereby forming facets of a laser cavity. Generally, a lower reflective coating is formed on one facet, and a higher reflective coating on the other facet, using a dielectric material such as a silicon nitride, to fabricate an intended laser device.

Conventionally, high optical power semiconductor laser devices have been used in a variety of fields such as optical communication systems, optical information recording on an optical disk and so on, laser printers and laser machining, solid-state laser excitation, optical sources for wavelength conversion such as SHG, and so on. In recent years, the demand for higher power of the semiconductor laser devices has increased substantially.

For example, in the field of optical communication systems, an optical amplifier (EDFA) fabricated using erbium doped fiber (EDF) was brought into practical use in the early 1990's. At the beginning of practice, the power required to a semiconductor laser device for use as an exciting optical source for exciting the EDFA was at most several tens of milliwatt (mW). However, with the dramatic advance of the recent wavelength division multiplex (WDM) technology and so on, semiconductor laser devices for use as exciting optical sources have been required to provide high power well exceeding 100 mW. In addition, the semiconductor laser devices are required to simultaneously have the driving reliability of driving for about 1,000,000 hours even at such high power.

Among factors which limit the high reliability of semiconductor laser devices, the most critical factor is the catastrophic optical damage (often called "COD") on the facets of a cavity. The COD results from positive feedback based on repetitions of a sequence of processes which involve absorption of light on the facets of the cavity; a temperature rise on the facets; a contraction of the band gap of a semiconductor material which comprises an active layer on the facets due to the increase of temperature; and an increase in the amount of absorbed light at the facet due to the contraction of the band gap.

The most effective expedient for suppressing the occurrence of such COD is to epitaxially grow a crystallized semiconductor material which has a band gap larger than that of the semiconductor material comprising the active layer. This epitaxially grown material is often referred to as the "large band gap semiconductor material".

For example, the inventors' Japanese Patent Application Publication No. 8-32167-A discloses a method which involves forming an upper electrode and a lower electrode in the aforementioned laminated laser structure, cleaving the structure to define the laser's facets, and growing a large band gap semiconductor material as mentioned above on a cleaved plane of the structure. As such, in this method, the large band gap semiconductor material grown on the facets is also deposited on the previously formed electrodes. Therefore, the growth of the large band gap semiconductor material on the facets is preferably done in a low-temperature environment (for example, in a range of 300° C. to 500® C.) to avoid any abnormal reactions between the large band gap semiconductor material and the material of the electrodes.

While this approach has worked for the inventors, they have observed that the thus treated facets sometimes have increased optical absorption characteristics for some types of laser devices, particularly those having material layers which contain aluminum (Al). The inventors have discovered that the increased absorption characteristics can reduce the lifetime of the laser diode and present obstacles to developing lasers with higher output power. The present invention is focused on reducing these undesirable optical absorption characteristics, while still reducing the occurrence of COD.

SUMMARY OF THE INVENTION

In the course of making their invention, the inventors have found there is oftentimes a thin but highly rigid film of aluminum oxide present at the laser facets for those laser diodes which are comprised of one or more layers having aluminum (Al) therein. This aluminum oxide layer is located at the cleaved surface, between the laminated laser structure and the epitaxial layer of the large band gap semiconductor material. The inventors have found that this aluminum oxide forms relatively quickly in the time between the cleaving operation and the epitaxial growth operation, even though this time is very short. The inventors have further discovered that the thin layer of aluminum oxide causes an abnormal growth condition for the large band gap semiconductor material, or any other type of semiconductor material grown thereon, which creates defects in the crystal structure of the grown material. In addition, the inventors have found that these defects increase the optical absorption at the laser's facets. The inventors have further found that attempts to reduce the aluminum oxide to aluminum by heating the device to temperatures above 500° C. or by exposing the device to a chemical reducing agent have not been practical with the present state of technology.

Broadly stated, the present invention provides a method of fabricating a semiconductor laser device which comprises the steps of cleaving a laminated structure comprised of semiconductor materials to form facets of a laser diode cavity, and epitaxially growing a semiconductor material on the facets of the laser diode cavity, wherein the step of cleaving and the step of epitaxially growing are performed in a low oxygen and moisture concentration atmosphere.

In some preferred embodiments of the present invention, the semiconductor material, which may be a compound semiconductor material, has a band gap which is larger than the bandgap of at least one of the layers of the laminated structure, and is preferably larger than the band gaps of a plurality of the layers of the laminated structure, particularly the active layers and the optical confinement layers.

In some of these preferred embodiments and still other preferred embodiments of the present invention, the laminated structure of the laser diode is maintained within a low oxygen concentration and low moisture concentration environment from the time of the end of the cleaving operation to the time of the start of the epitaxial growth operation.

Accordingly, it is an object of the present invention to reduce or eliminate undesirable optical absorption characteristics at the facets of a laser diode.

It is another object of the present invention to provide a method of fabricating a semiconductor laser device which increases the optical output power of the device.

It is still another object of the present invention to provide a method of fabricating a semiconductor laser device which increases the lifetime of the device.

It is object of some preferred embodiments of the present invention to provide one or more of the forgoing benefits while reducing or eliminating the occurrence of catastrophic optical destruction.

These and other objects of the present invention will become apparent to one of ordinary skill in the art in reviewing the present specification and attached claims.

DETAILED DESCRIPTION OF THE INVENTION

Figure 1:
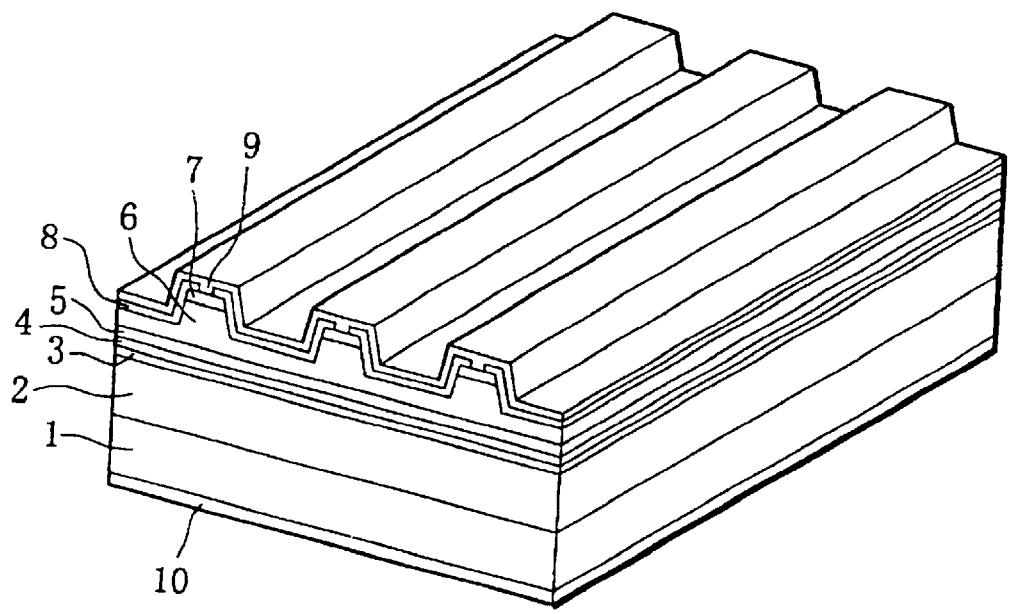
FIG. 1 is a perspective view illustrating an exemplary laminated structure of a semiconductor material before cleavage.

For forming high quality coatings grown on the facets, the inventors have recognized in their invention that oxidation of a cleaved plane due to oxygen and moisture should be prevented. A high vacuum environment may be used to achieve concentrations of oxygen and water below 1 part per million (ppm). However, the inventors have found that same concentrations and beneficial effects can be achieved at normal or low vacuums by using atmospheres formed mainly of one or more inert gases, such as nitrogen or argon, if the partial pressures of oxygen and water are kept to levels which correspond to approximately 1 ppm. In this substantially inert atmosphere, a cleaved plane is covered with the inert gas simultaneously with the occurrence of cleaving operation, causing a reduction in oxidation speed ion the cleaved plane, i.e., preventing the formation of an oxide film.

The inventors cleaved a laminated structure in a controlled working atmosphere of inert gas with oxygen and water concentrations at less than 1 ppm, and subsequently formed facet grown coatings of compound semiconductor on cleavage planes by a low temperature epitaxial crystal growth method. Upon comparison of the coating in quality with a facet grown coating formed on a cleavage plane, which had been formed in a high vacuum, the inventor found the fact that the two coatings were substantially equivalent in quality.

Particularly, the concentrations of both oxygen and moisture are preferably lower than 1 ppm during the cleaving operation and epitaxial crystal growth operation.

A laminated laser structure suitable for use in practicing the present invention may be constructed in the following manner. First, an epitaxial crystal growth method, such as the MOCVD method, is applied in a crystal growth chamber to sequentially laminate, on a predetermined semiconductor substrate, the aforementioned lower cladding layer, the lower optical confinement layer, the one or more active layers, the upper optical confinement layer, the upper cladding layer and the cap layer to form a slab laminated structure which has a laser oscillating function. Next, the top surface of the laminated structure may be machined into a ridge shape if desired or if required, and the back surface of the substrate is preferably lapped. An upper electrode is formed on the top surface of the laminated structure, and a lower electrode is form on the back surface of the substrate.

Thereafter, according to the present invention, the laminated structure is cleaved to provide a cavity length of an intended design to fabricate a bar of laser element. Then, a compound semiconductor is epitaxially grown on exposed cleaved planes (facets of the cavity). According to the present invention, the cleaving step is performed in a cleaving chamber as follows. Specifically, the cleaving chamber is filled with an inert gas such as $N_2$ (nitrogen) or Ar (argon) using, for example, a cyclic purifier, prior to the cleaving step through to at least the end of the cleaving step. Preferably, the concentrations of oxygen and moisture (water molecules) in this working atmosphere are set at values lower than 1 ppm. The inventors have discovered that if the concentrations of oxygen and moisture are substantially higher than approximately 1 ppm, or if the partial pressures oxygen or water are above approximately $7.6 \times 10^{-4}$ torr, a cleaved plane will be rapidly oxidized when a semiconductor material in the laminated structure includes Al, as is the case with AlGaAs or AlGaInP layers. The inventors have further discovered that the oxygen is strongly bonded to the aluminum, and cannot be readily de-bonded from the aluminum by heating to temperatures under 500° C., even when using a reducing agent or gas (e.g., reducing atmosphere).

In some preferred embodiments of the present invention, the laser devices are cleaved in the above way with one or both of the oxygen and water having partial pressures maintained at or below approximately $7.6 \times 10^{-5}$ torr, and more preferably at or below approximately $1.5 \times 10^{-5}$ torr. For a standard atmospheric pressure of 760 torr, these partial pressure values correspond to concentrations of 100 parts per billion (ppb) and 20 ppb, respectively. Stated a further way, the laser devices in these embodiments are cleaved in the above way with one or both of the oxygen and water concentrations being maintained at or below approximately 100 ppb, and more preferably at or below a approximately 20 ppb.

It should be noted that the foregoing cleaving operation may be manually performed in a closed chamber as long as the working atmosphere is held in the atmosphere mentioned above. Alternatively, an automated cleaving apparatus may be used to perform the cleaving operation.

The bar of laser device resulting from the completion of the cleaving step is preferably transported to a crystal growth chamber which is coupled to the cleaving chamber by a sealed pathway, and a compound semiconductor is thereafter epitaxially grown on the cleaved planes. In this case, the pathway which couples the cleaving chamber to the crystal growth chamber is set up in the low oxygen/moisture concentration atmosphere as mentioned above. As a result, the cleaved planes are prevented from being oxidized during transportation.

It may be appreciated that the present invention may be practiced without having a sealed pathway between the cleaving chamber and the growth chamber. For example, a sealable and substantially air-tight transport container may be opened and placed in the cleaving chamber before the cleaving operation begins. The cleaving chamber may then be filled with the desired low oxygen/moisture concentration atmosphere, which fills the open container with the same atmosphere. After the cleaving operation has been performed, the bars of laser devices are placed in a air-tight transport container, and the container is sealed. The transport container may then be removed from the cleaving chamber and placed in the growth chamber, and unsealed once a desired low oxygen/moisture concentration atmosphere has been established in the growth chamber.

Thus, in each of the above transport examples, the laser devices are maintained in the desired low oxygen/moisture concentration atmosphere from the end of the cleaving step to the start of epitaxial growth step without increasing the concentrations of oxygen and water above approximately 1 ppm each during transport, or without increasing partial pressures of oxygen and water above approximately $7.6 \times 10^{-4}$ torr. In preferred embodiments of the present invention, the laser devices are transported in the above way with one or both of the oxygen and water having partial pressures maintained at or below approximately $7.6 \times 10^{-5}$ torr, and more preferably at or below approximately $1.5 \times 10^{-5}$ torr. For a standard atmospheric pressure of 760 torr, these latter two partial pressure values correspond to concentrations of 100 parts per billion (ppb) and 20 ppb, respectively.

The epitaxial crystal growth may be performed, for example, through application of the MOCVD method, molecular beam epitaxial deposition method, or the like. The facet growth coatings which results from the epitaxial growth step are shown at 12 in FIG. 2. They cover substantially all of the exposed semiconductor material. The epitaxial growth preferably occurs with the concentrations of oxygen and water each being at or below approximately 1 ppm. For a typical chamber pressure of 76 torr for a MOCVD process, this concentration corresponds to a partial pressure of approximately $7.6 \times 10^{-5}$ torr.

In some preferred embodiments of the present invention, the facet growth coatings are formed with one or both of the oxygen and water having partial pressures maintained at or below approximately $7.6 \times 10^{-6}$ torr, and more preferably at or below approximately $1.5 \times 10^{-6}$ torr. For a chamber pressure of 76 torr, these partial pressure values correspond to concentrations of 100 parts per billion (ppb) and 20 ppb, respectively. Stated a further way, the facet growth coatings in these embodiments are formed with one or both of the oxygen and water concentrations being maintained at or below approximately 100 ppb, and more preferably at or below a approximately 20 ppb.

Preferably, compound semiconductors used for growth on the facets are, for example, InGaP, InGaAsP, GaAs and so on which allow the formation of a high quality coating even at relatively low growth temperature and do not include aluminum. However, it may be appreciated that compound semiconductors which include aluminum may be used to form facet growth coatings 12 so long as there is no substantial amount of aluminum oxide between the facets and coatings 12. In addition, it is preferred that the material used to form facet growth coatings 12 is non-doped (or intrinsic material) and has a band gap which is higher than the band gaps of at least the active layers and the optical confinement layers of the laminated structure (e.g., layers 3–5 shown in FIG. 1). It is further preferred that the material has a band gap which is also higher than the band gaps of the cladding layers (e.g., layers 2 and 6 shown in FIG. 1).

In this way, the facet growth coatings 12 are formed on the facets of the cavity. Since the cleavage is performed in the aforementioned working atmosphere, the cleavage plane is prevented from being oxidized. Consequently, the facet grown coatings formed by the epitaxial crystal growth method exhibit a high quality with less defects.

Example

An exemplary laminated structure as illustrated in FIG. 1 was fabricated as follows.

First, on a substrate 1 made of n-GaAs, a lower cladding layer 2 made of n-AlGaAs and having a thickness of 3 μm, a lower optical confinement layer 3 made of non-doped AlGaAs and having a thickness of 30 nm, an active layer 4 made of non-doped InGaAs/GaAs, comprising a lattice mismatched multi-quantum well structure and having a thickness of 7 nm, an upper optical confinement layer 5 made of non-doped AlGaAs and having a thickness of 30 nm, an upper cladding layer 6 made of p-AlGaAs and having a thickness of 2 μm, and a cap layer 7 made of p-GaAs were laminated in sequence to fabricate a slab laminated structure.

Next, the surface of the cap layer 7 was processed into a ridge shape by photolithography and etching.

Next, a protection coating 8 made of silicon nitride ($Si_3N_4$) was formed over the entire surface, and then a peak portion of the ridge was removed by etching to expose the cap layer 7 on which the conductive material layers of Ti/Pt/Au were sequentially vapor deposited to form an upper electrode 9. Further, the back surface of the substrate 1 was lapped, and the conductive material layers of AuGeNi/Au were sequentially vapor evaporated on the lapped back surface to form a lower electrode 10.

The laminated structure was placed in a cleavage chamber which was filled with circulating Ar and controlled to have an oxygen concentration at 20 ppb and a moisture concentration at 20 ppb at a pressure of 760 torr (standard pressure), and was cleaved therein.

Next, the laminated structure was transported to a crystal growth chamber which was set up in the same atmosphere (20 ppb) as the cleavage chamber but at a pressure of 76 torr, wherein InGaP was epitaxially grown at temperature of 400° C. to form facet grown coatings on cleavage planes.

Figure 2:
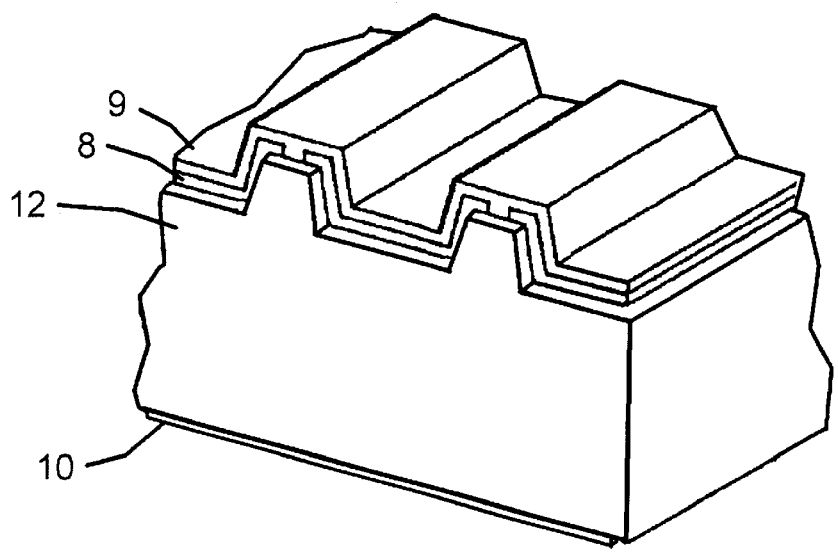
FIG. 2 is a perspective view of the structure shown in FIG. 1 after an epitaxial layer of semiconductor material is formed on the facets of the laser devices.

The facet grown coatings and the vicinity of the cleavage planes of the resulting laser device were subjected to two-dimensional ion mass spectroscopic analysis (SIMS). The result of the analysis is shown in FIG. 2.

For comparison, a laser device was fabricated in a similar manner to the foregoing Example except for the cleavage which was performed in a working atmosphere with an oxygen concentration of 2 ppm and a moisture concentration of 2 ppm at a pressure of 760 torr, and similarly subjected to the SIMS. The result of the SIMS is shown in FIG. 3.

Figure 3:
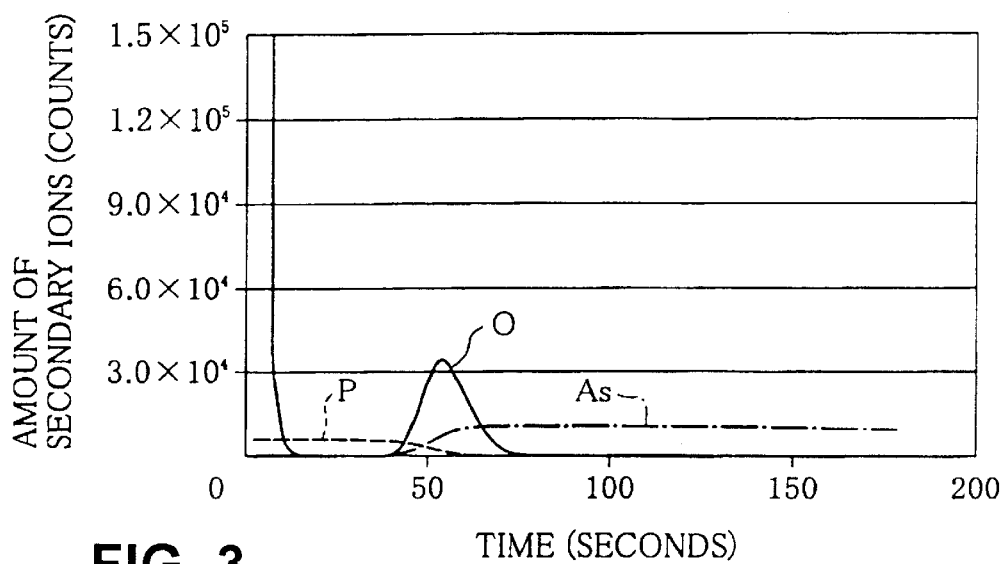
FIG. 3 is a graph showing the result of an SIMS measurement for a device according to an embodiment.
Figure 4:
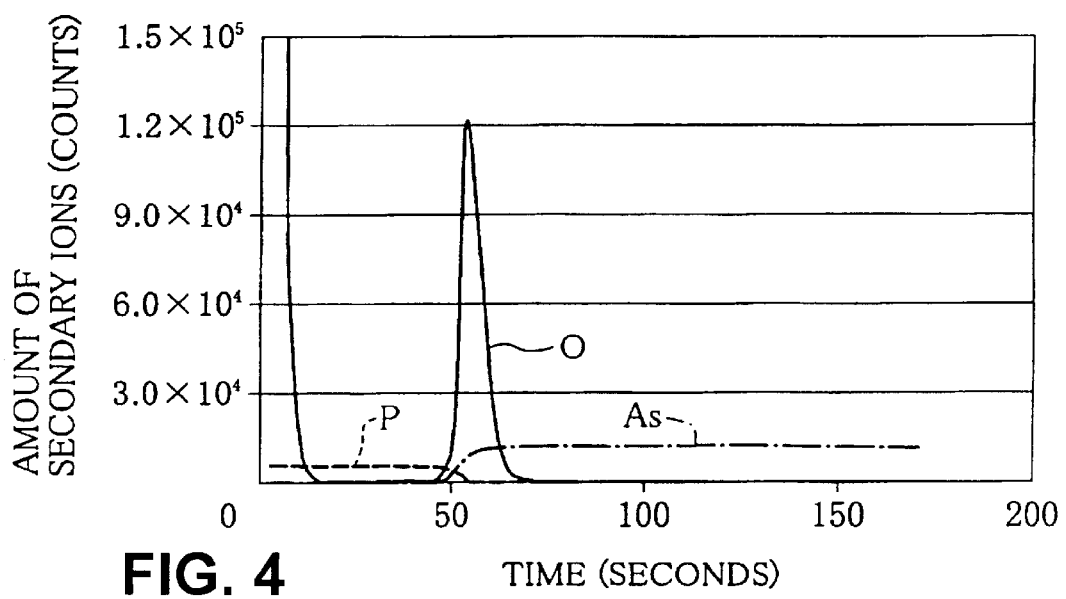
FIG. 4 is a graph showing the result of an SIMS measurement for a device of a comparative example.

As is apparent from a comparison of FIG. 3 with FIG. 4, the laser device of the Example exhibits an extremely reduced amount of oxygen near the cleavage planes (the facets of the cavity) as compared with the comparative example. In other words, the effect resulting from the reduced concentrations of oxygen and moisture in the cleavage chamber is clearly demonstrated.

Also, the laser device of the Example and the laser device of the comparative example were oscillated at optical power of 300 mW in an environment maintained at a temperature of 25° C., and the MTTF (Mean Time to Failure) was measured for the two laser devices while they were being oscillated.

The laser device of the Example had a MTTF of $5\times10^7$ hours of MTTF, while the laser device of the comparative example had a MTTF of $1\times10^7$ hours.

As is apparent from the foregoing, the laser device of the Example provides a high COD suppression effect, a long lifetime, and a high driving reliability.

As described above, according to the present invention, since the oxidation on the facets during the cleavage is suppressed, the facet grown coatings deposited on the cleavage planes have a high quality, thereby making it possible to fabricate a laser device which exhibits suppressed occurrence of COD.

What is claimed is:

1. A method of fabricating a semiconductor laser device comprising the steps of:

cleaving a laminated structure which comprises one or more semiconductor materials to form facets of a cavity, said step of cleaving being performed in an atmosphere having approximately one part per million or less of oxygen molecules and approximately one part per million or less of water molecules; and epitaxially growing a compound semiconductor on the facets of the cavity, said step of epitaxially growing being performed in an atmosphere having approximately one part per million or less of oxygen molecules and approximately one part per million or less of water molecules.

2. The method of fabricating a semiconductor laser device according to claim 1, wherein all or part of the layers of the laminated structure include aluminum.

3. The method of fabricating a semiconductor laser device according to claim 1, wherein at least one of the layers of the laminated structure includes aluminum.

4. The method of fabricating a semiconductor laser device according to claim 1, wherein the compound semiconductor which is epitaxially grown on the facets of the cavity comprises InGaP.

5. The method of fabricating a semiconductor laser device according to claim 2, wherein the compound semiconductor which is epitaxially grown on the facets of the cavity comprises InGaP.

6. The method of fabricating a semiconductor laser device according to claim 1, wherein said step of cleaving and said step of epitaxially growth are each performed in an atmosphere having approximately one hundred parts per billion or less of oxygen molecules and approximately one hundred parts per billion or less of water molecules.

7. The method of fabricating a semiconductor laser device according to claim 1, wherein said step of cleaving and said step of epitaxially growth are each performed in an atmosphere having approximately twenty parts per billion or less of oxygen molecules and approximately twenty parts per billion or less of water molecules.

8. The method of fabricating a semiconductor laser device according to claim 1, wherein said step of cleaving is performed in an atmosphere having a partial pressure of oxygen of approximately $7.6\times10^{-4}$ torr or less.

9. The method of fabricating a semiconductor laser device according to claim 1, wherein said step of cleaving is performed in an atmosphere having a partial pressure of oxygen of approximately $7.6\times10^{-5}$ torr or less.

10. The method of fabricating a semiconductor laser device according to claim 1, wherein said step of cleaving is performed in an atmosphere having a partial pressure of oxygen of approximately $1.5\times10^{-5}$ torr or less.

11. The method of fabricating a semiconductor laser device according to claim 1, wherein said step of cleaving is performed in an atmosphere having a partial pressure of water of approximately $7.6\times10^{-4}$ torr or less.

12. The method of fabricating a semiconductor laser device according to claim 1, wherein said step of cleaving is performed in an atmosphere having a partial pressure of water of approximately $7.6\times10^{-5}$ torr or less.

13. The method of fabricating a semiconductor laser device according to claim 1, wherein said step of cleaving is performed in an atmosphere having a partial pressure of water of approximately $1.5\times10^{-5}$ torr or less.

14. The method of fabricating a semiconductor laser device according to claim 1, wherein said step of epitaxial growth is performed in an atmosphere having a partial pressure of oxygen of approximately $7.6\times10^{-5}$ torr or less.

15. The method of fabricating a semiconductor laser device according to claim 1, wherein said step of epitaxial growth is performed in an atmosphere having a partial pressure of oxygen of approximately $7.6\times10^{-6}$ torr or less.

16. The method of fabricating a semiconductor laser device according to claim 1, wherein said step of epitaxial growth is performed in an atmosphere having a partial pressure of oxygen of approximately $1.5\times10^{-6}$ or less.

17. The method of fabricating a semiconductor laser device according to claim 1, wherein said step of epitaxial growth is performed in an atmosphere having a partial pressure of water of approximately $7.6\times10^{-5}$ torr or less.

18. The method of fabricating a semiconductor laser device according to claim 1, wherein said step of epitaxial growth is performed in an atmosphere having a partial pressure of water of approximately $7.6\times10^{-6}$ torr or less.

19. The method of fabricating a semiconductor laser device according to claim 1, wherein said step of epitaxial growth is performed in an atmosphere having a partial pressure of water of approximately $1.5\times10^{-6}$ torr or less.

20. A method of fabricating a semiconductor laser device comprising the steps of:

cleaving a laminated structure which comprises one or more semiconductor materials to form facets of a cavity, said step of cleaving being performed in an atmosphere having approximately one part per million or less of oxygen molecules and approximately one part per million or less of water molecules; and epitaxially growing a compound semiconductor on the facets of the cavity, said step of epitaxially growing being performed in an atmosphere having approximately one part per million or less of oxygen molecules and approximately one part per million or less of water molecules; and wherein the laminated structure is maintained in an atmosphere having approximately one part per million or less of oxygen molecules and approximately one part per million or less of water molecules from the time of the end of the cleaving step to the time of the start of the epitaxial growth step.

21. The method of fabricating a semiconductor laser device according to claim 1, wherein the steps of cleaving and epitaxial growth are conducted at temperatures below 500° C.

22. The method of fabricating a semiconductor laser device according to claim 1, further comprising the step of forming an electrode on each of a top surface and a bottom surface of the laminated structure prior to the step of cleaving.

23. A method of fabricating a semiconductor laser device comprising the steps of:

cleaving a laminated structure which comprises one or more semiconductor materials to form facets of a cavity; and epitaxially growing a compound semiconductor on the facets of the cavity, wherein said step of cleaving is performed in an atmosphere having a partial pressure of oxygen of approximately $7.6 \times 10^{-4}$ torr or less and a partial pressure of water of approximately $7.6 \times 10^{-4}$ torr or less, and wherein said step of epitaxial growth is performed in an atmosphere having a partial pressure of oxygen of approximately $7.6 \times 10^{-5}$ torr or less and a partial pressure of water of approximately $7.6 \times 10^{-5}$ torr or less.

24. The method of fabricating a semiconductor laser device according to claim 23, wherein said step of cleaving is performed in an atmosphere having a partial pressure of oxygen of approximately $7.6 \times 10^{-5}$ torr or less.

25. The method of fabricating a semiconductor laser device according to claim 23, wherein said step of cleaving is performed in an atmosphere having a partial pressure of oxygen of approximately $1.5 \times 10^{-5}$ torr or less.

26. The method of fabricating a semiconductor laser device according to claim 23, wherein said step of cleaving is performed in an atmosphere having a partial pressure of water of approximately $7.6 \times 10^{-5}$ torr or less.

27. The method of fabricating a semiconductor laser device according to claim 23, wherein said step of cleaving is performed in an atmosphere having a partial pressure of water of approximately $1.5 \times 10^{-5}$ torr or less.

28. The method of fabricating a semiconductor laser device according to claim 23, wherein said step of epitaxial growth is performed in an atmosphere having a partial pressure of oxygen of approximately $7.6 \times 10^{-6}$ torr or less.

29. The method of fabricating a semiconductor laser device according to claim 23, wherein said step of epitaxial growth is performed in an atmosphere having a partial pressure of oxygen of approximately $1.5 \times 10^{-6}$ or less.

30. The method of fabricating a semiconductor laser device according to claim 23, wherein said step of epitaxial growth is performed in an atmosphere having a partial pressure of water of approximately $7.6 \times 10^{-6}$ torr or less.

31. The method of fabricating a semiconductor laser device according to claim 23, wherein said step of epitaxial growth is performed in an atmosphere having a partial pressure of water of approximately $1.5 \times 10^{-6}$ torr or less.

32. The method of fabricating a semiconductor laser device according to claim 23, wherein all or part of the layers of the laminated structure include aluminum.

33. The method of fabricating a semiconductor laser device according to claim 23, wherein the compound semiconductor which is epitaxially grown on the facets of the cavity comprises InGaP.

34. A method of fabricating a semiconductor laser device comprising the steps of:

cleaving a laminated structure which comprises one or more semiconductor materials to form facets of a cavity, said step of cleaving being performed in an atmosphere having a partial pressure of oxygen of approximately $7.6 \times 10^{-4}$ torr or less and a partial pressure of water of approximately $7.6 \times 10^{-4}$ torr or less;

epitaxially growing a compound semiconductor on the facets of the cavity, said step of epitaxial growth being performed in an atmosphere having a partial pressure of oxygen of approximately $7.6 \times 10^{-5}$ torr or less and a partial pressure of water of approximately $7.6 \times 10^{-5}$ torr or less; and maintaining the laminated structure in an atmosphere having a partial pressure of oxygen of approximately $7.6 \times 10^{-4}$ torr or less and a partial pressure of water of approximately $7.6 \times 10^{-4}$ torr or less from the time of the end of the cleaving step to the time of the start of the epitaxial growth step.

35. The method of fabricating a semiconductor laser device according to claim 23, wherein the steps of cleaving and epitaxial growth are conducted at temperatures below 500° C.

36. The method of fabricating a semiconductor laser device according to claim 1, wherein said step of cleaving is performed in an atmosphere having approximately twenty parts per billion or less of oxygen molecules and approximately twenty parts per billion or less of water molecules.

* * * * *